(12) United States Patent
Uchida et al.

(10) Patent No.: US 11,145,784 B2
(45) Date of Patent: Oct. 12, 2021

(54) LIGHT-EMITTING THYRISTOR, LIGHT-EMITTING THYRISTOR ARRAY, EXPOSURE HEAD, AND IMAGE FORMING APPARATUS

(71) Applicant: CANON KABUSHIKI KAISHA, Tokyo (JP)

(72) Inventors: Takeshi Uchida, Hiratsuka (JP); Takako Suga, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/810,000

(22) Filed: Mar. 5, 2020

(65) Prior Publication Data
US 2020/0287073 A1 Sep. 10, 2020

(30) Foreign Application Priority Data
Mar. 6, 2019 (JP) .............................. JP2019-040659

(51) Int. Cl.
| | | |
|---|---|---|
| *H01L 33/00* | (2010.01) | |
| *G03G 15/04* | (2006.01) | |
| *H01L 33/06* | (2010.01) | |
| *H01L 27/15* | (2006.01) | |
| *H01L 33/30* | (2010.01) | |

(52) U.S. Cl.
CPC ... *H01L 33/0016* (2013.01); *G03G 15/04036* (2013.01); *H01L 27/153* (2013.01); *H01L 33/06* (2013.01); *H01L 33/30* (2013.01)

(58) Field of Classification Search
CPC ........ G03G 15/04036; G03G 15/04045; H01L 33/006; H01L 33/06; H01L 33/10
See application file for complete search history.

(56) References Cited

U.S. PATENT DOCUMENTS

| | | | | |
|---|---|---|---|---|
| 6,841,805 B2* | 1/2005 | McCann | ................ | B82Y 20/00 257/103 |
| 8,803,274 B2* | 8/2014 | Kyono | .................... | H01L 33/16 257/463 |
| 2012/0327422 A1* | 12/2012 | Inao | .................... | G01B 9/02091 356/479 |
| 2019/0070864 A1 | 3/2019 | Uchida et al. | | |

FOREIGN PATENT DOCUMENTS

| | | | |
|---|---|---|---|
| JP | 63196084 A | | 8/1988 |
| JP | 2013065591 A | * | 4/2013 |

OTHER PUBLICATIONS

Kondo et al., JP 2013-065591 A, Apr. 2013, JPO Computer Translation (Year: 2013).*

* cited by examiner

*Primary Examiner* — Erika J Villaluna
(74) *Attorney, Agent, or Firm* — Venable LLP

(57) ABSTRACT

A light-emitting thyristor includes a layered structure having a semiconductor DBR layer, a first semiconductor layer of a first conductivity type, a second semiconductor layer of a second conductive type, a third semiconductor layer, and a fourth semiconductor layer of the second conductivity type in this order on a semiconductor substrate, the third semiconductor layer has at least one fifth semiconductor layer of the first conductivity type and a multi-quantum well structure, the fifth semiconductor layer is present between the second semiconductor layer and the multi-quantum well structure, the multi-quantum well structure is formed of barrier layers and quantum well layers, and the number of the quantum well layers is greater than or equal to 10.

20 Claims, 8 Drawing Sheets

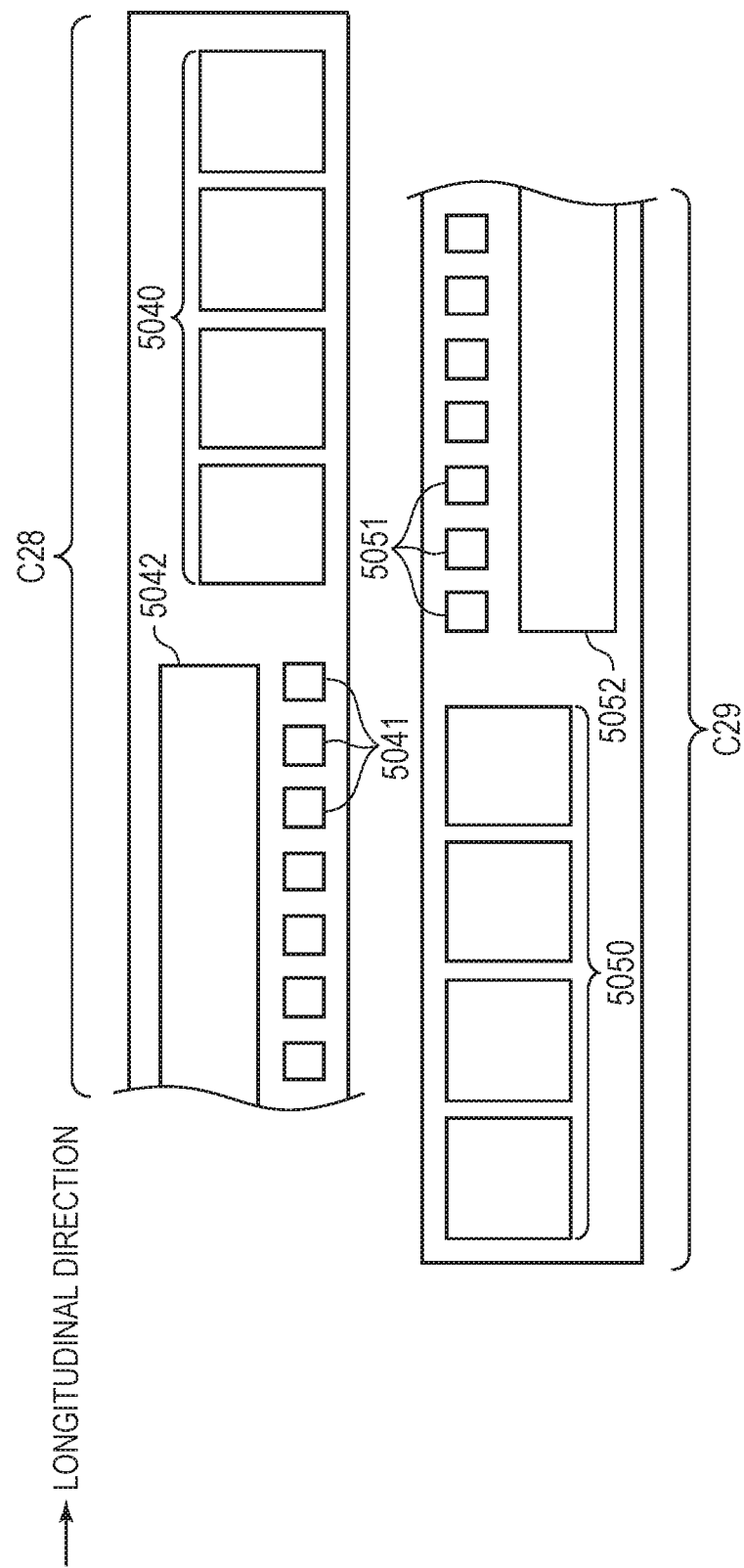

LIGHT-EMITTING THYRISTOR, LIGHT-EMITTING THYRISTOR ARRAY, EXPOSURE HEAD, AND IMAGE FORMING APPARATUS

BACKGROUND OF THE INVENTION

Field of the Invention

The present invention relates to a light-emitting thyristor, a light-emitting thyristor array, an exposure head, and an image forming apparatus.

Description of the Related Art

As a head used for forming a latent image on a photosensitive drum of an image forming apparatus, a surface light-emitting element array is used. In a typical configuration of such a head, a plurality of plane light-emitting elements (light-emitting elements that emit light perpendicular to the primary face of a semiconductor substrate) are aligned in a certain direction, and a lens array is arranged in the same direction as the alignment direction of light-emitting elements. The light from the light-emitting elements are then captured on the photosensitive drum through the lens. As the light-emitting element, an element formed of a light-emitting diode (LED) and an element formed of a light-emitting thyristor are known.

The configuration disclosed in Japanese Patent Application Laid-Open No. S63-196084 is known as a specific configuration of a light-emitting thyristor. In the configuration disclosed in Japanese Patent Application Laid-Open No. S63-196084, a first n-type semiconductor layer, a first p-type semiconductor layer, a second n-type semiconductor layer, and a second p-type semiconductor layer are formed on an n-type semiconductor substrate, and seven quantum well structures are formed inside the second n-type semiconductor layer.

In the light-emitting thyristor disclosed in Japanese Patent Application Laid-Open No. S63-196084, however, it is difficult to improve light emission efficiency while maintaining a function as a thyristor.

SUMMARY OF THE INVENTION

In view of the above problem, the present invention intends to provide a light-emitting thyristor that improves light emission efficiency while maintaining a function as a thyristor.

A light-emitting thyristor as one aspect of the present invention includes: a layered structure having a semiconductor DBR layer, a first semiconductor layer of a first conductivity type, a second semiconductor layer of a second conductive type, a third semiconductor layer, and a fourth semiconductor layer of the second conductivity type in this order on a semiconductor substrate, the third semiconductor layer has at least one fifth semiconductor layer of the first conductivity type and a multi-quantum well structure, the fifth semiconductor layer is present between the second semiconductor layer and the multi-quantum well structure, the multi-quantum well structure is formed of barrier layers and quantum well layers, and the number of the quantum well layers is greater than or equal to 10.

A light-emitting thyristor as another aspect of the present invention includes: a layered structure having a semiconductor DBR layer, a first semiconductor layer of a first conductivity type, a second semiconductor layer, a third semiconductor layer of the first conductivity type, and a fourth semiconductor layer of a second conductivity type on in this order a semiconductor substrate, the second semiconductor layer has at least one fifth semiconductor layer of the second conductivity type and a multi-quantum well structure, the fifth semiconductor layer is present between the first semiconductor layer and the multi-quantum well structure, the multi-quantum well structure is formed of barrier layers and quantum well layers, and the number of the quantum well layers is greater than or equal to 10.

Further features of the present invention will become apparent from the following description of exemplary embodiments with reference to the attached drawings.

BRIEF DESCRIPTION OF THE DRAWINGS

FIG. 6C is a diagram schematically illustrating the structure of the printed circuit board on which the light-emitting element array chip group of the fifth example is arranged.

DESCRIPTION OF THE EMBODIMENTS

Embodiments of the present invention will be described below in detail. Note that the present invention is not limited to the following embodiments, and the scope of the present invention includes an embodiment in which change, modification, or the like are added as appropriate to the following embodiments based on ordinary knowledge of those skilled in the art within a scope not departing from the spirit of the present invention.

Figure 1A:
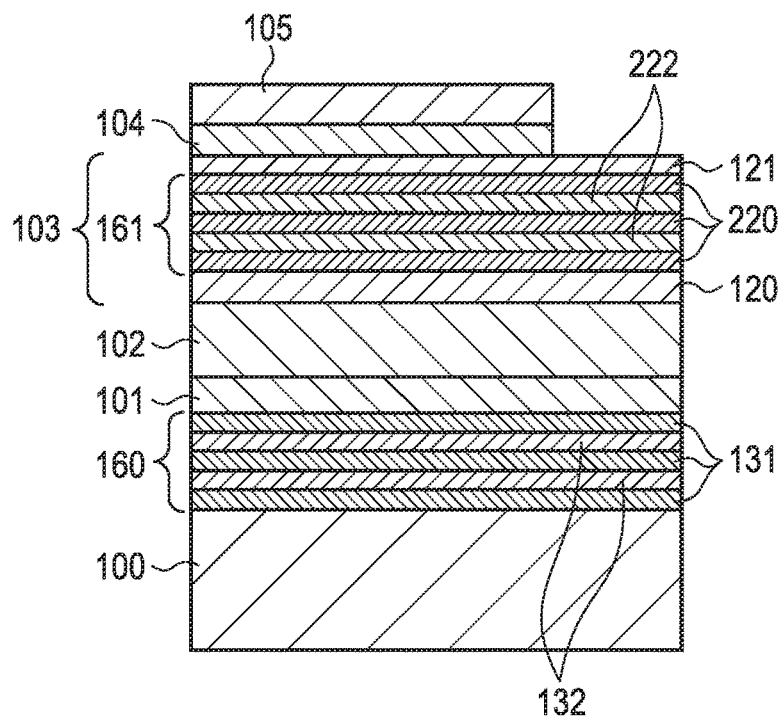
FIG. 1A is a sectional view schematically illustrating the structure of a light-emitting thyristor according to an embodiment.

FIG. 1A is a sectional view illustrating a configuration of a semiconductor layer of a light-emitting thyristor according to the present embodiment. As illustrated in FIG. 1A, the light-emitting thyristor according to the present embodiment has a layered structure having a plurality of semiconductor layers stacked on a semiconductor substrate 100. That is, in the light-emitting thyristor according to the present embodiment, a semiconductor distributed Bragg reflector (DBR) layer 160, a cathode layer 101, a p-base layer 102, an n-gate layer 103, an anode layer 104, and an overflow suppression layer 105 are stacked in this order on the semiconductor substrate 100. A multi-quantum well structure (MQW structure) 161 is arranged as a light-emitting layer inside the n-gate layer 103. Further, the n-gate layer 103 has a spacer layer 120 arranged between the MQW structure 161 and the p-base layer 102 and a spacer layer 121 arranged between the MQW structure 161 and the anode layer 104.

The semiconductor substrate 100 is a semiconductor substrate of a first conductivity type. The semiconductor DBR layer 160 is formed with two types of different semiconductor layers of the first conductivity type being stacked alternatingly. A buffer layer that is a semiconductor layer of the first conductivity type may be arranged between the semiconductor substrate 100 and the semiconductor DBR layer 160. The cathode layer 101 is a first semiconductor layer of the first conductivity type. The p-base layer 102 is a second semiconductor layer of a second conductivity type that is different from the first conductivity type. At least a part of the n-gate layer 103 is a third semiconductor layer of the first conductivity type. The n-gate layer 103 has a MQW structure 161 of the first conductivity type or the i-type and has a spacer layers 120 and 121 that are a plurality of fifth semiconductor layers of the first conductivity type. The anode layer 104 is a fourth semiconductor layer of the second conductivity type.

When the configuration described above including the p-base layer 102 and the n-gate layer 103, the first conductivity type is the n-type, and the second conductivity type is the p-type. In such a case, the layered structure having the semiconductor DBR layer, the n-type first semiconductor layer (cathode layer), the p-type second semiconductor layer (p-base layer), the third semiconductor layer (n-gate layer), and the p-type fourth semiconductor layer (anode layer) are formed in this order on the semiconductor substrate. At least a part of the third semiconductor (n-gate layer) is the n-type and has a MQW structure of the n-type or the i-type and a plurality of n-type fifth semiconductor layers (spacer layer). The fifth semiconductor layer is not necessarily required to have multiple layers as long as at least one fifth semiconductor layer (spacer layer) is present between the second semiconductor layer (p-base layer) and the MQW structure.

Further, the light-emitting thyristor according to the present embodiment can have the anode electrode, the cathode electrode, and the gate electrode as described in each example described later.

Further, in the present specification, the i-type semiconductor layer refers to a non-doped (undoped) semiconductor layer. The term of non-doped (undoped) means that no dopant for controlling the conductivity type is intentionally doped during growth of a semiconductor layer. It is preferable that the dopant concentration in the i-type semiconductor layer be less than or equal to $1\times10^{16}$ cm$^{-3}$. Note that, even when no dopant atom is introduced during crystal growth, there may be entry of atoms serving as a dopant in the crystal due to crystal growth. In such a case, by intentionally introducing a dopant exhibiting the opposite conductivity type of the same level for cancellation, it is possible to realize a state where the number of carriers is substantially small (the carrier concentration is less than or equal to $1\times10^{16}$ cm$^{-3}$). A non-doped state includes such a state. What is important in the non-doped semiconductor layer is that the carrier concentration in the semiconductor is preferably less than or equal to $1\times10^{16}$ cm$^{-3}$ consequently.

Further, the semiconductor substrate 100 and each semiconductor layer are not particularly limited but are preferably formed of a group III-V compound semiconductor. As a group III-V compound semiconductor, it is preferable to use a GaAs-based material, an AlGaAs-based material, a GaP-based material, a GaAsP-based material, an InP-based material, an AlAs-based material, or an AlGaInP-based material. It is preferable that each semiconductor layer contain a GaAs-based material or an AlGaAs-based material in terms of a light emission wavelength. Further, as a specific dopant element in each semiconductor layer, Zn or Mg that is a group II element, C or Si that is a group IV element, Se that is a group VI element, or the like may be used when each semiconductor layer is formed of an AlGaAs-based material that is a group III-V semiconductor.

Next, details of each semiconductor layers of the light-emitting thyristor according to the present embodiment will be described with reference to specific examples. Note that the configuration of each semiconductor layer is not limited to the specific examples, and various configurations may be employed.

The semiconductor substrate 100 is a GaAs substrate. The semiconductor DBR layer 160 has a layered structure in which an $Al_{0.2}GaAs$ layer 132 that is a high refractive index layer and an $Al_{0.8}GaAs$ layer 131 that is a low refractive index layer are paired and both layers are alternatingly stacked. The number of stacked pairs is 20. The optical film thickness (optical thickness) of each layer of the $Al_{0.2}GaAs$ layer 132 and the $Al_{0.8}GaAs$ layer 131 is one-fourth of 780 nm that is the light emission wavelength of the light-emitting thyristor. Herein, the optical film thickness is a value obtained by multiplying a physical film thickness by the refractive index of the film. Both the layers have the same optical film thickness of one-fourth of 780 nm but have different actual film thicknesses because of different refractive indices. The cathode layer 101 is made of AlGaAs. The p-base layer 102 is made of $Al_{0.22}GaAs$ and has a thickness of 700 nm and a doping concentration of $3\times10^{17}$ cm$^{-3}$. Each of the spacer layers 120 and the spacer layer 121 is made of $Al_{0.22}GaAs$ and has a doping concentration of $2\times10^{17}$ cm$^{-3}$. The thickness of the spacer layer 120 is 100 nm, and the thickness of the spacer layer 121 is 95 nm. The thickness of the n-gate layer 103 is 350 nm in total including the MQW structure 161, the spacer layer 120, and the spacer layer 121 arranged therein. The anode layer 104 is made of AlGaAs. The overflow suppression layer 105 is made of $Al_{0.8}GaAs$ and has a thickness of 150 nm. The MQW structure 161 is formed with quantum well layers 220 and barrier layers 222 having a larger bandgap than the quantum well layers 220 being alternatingly stacked. The light emission wavelength of a ground state of the quantum well structure is 780 nm. A bandgap difference $\Delta E_g$ that is the difference between the bandgap of the quantum well layers 220 and the barrier layers 222 interposing the quantum well layer 220 is 0.105 eV. Each of the barrier layer 222 and the quantum well layer 220 is formed of an AlGaAs-based material. The thickness of the quantum well layer 220 is 6 nm. The number of quantum wells of the MQW structure 161 is 25. Note that, out of the barrier layers 222 and the quantum well layers 220 forming the MQW structure 161, the number of quantum wells is the number of quantum well layers 220.

In such a way, in the light-emitting thyristor according to the present embodiment, the number of quantum wells of the MQW structure 161 is 25. Note that the number of quantum wells of the MQW structure 161 is not limited to 25 and may be any number greater than or equal to 10.

The reason why 25 is selected as the number of quantum wells in the present embodiment and a problem related thereto will be more specifically described.

In general, in an image forming apparatus, higher light emission efficiency (a light emission amount to an injecting current) of a light-emitting element used for an exposure head or the like is preferable. There are various advantages in high light emission efficiency. For example, by reducing the supply current required to obtain a certain light, it is possible to reduce a heat amount generated from a light-emitting element array portion inside the image forming apparatus. Further, by increasing a light amount per unit time, it is possible to form a latent image within a shorter period and, as a result, improve the printing speed.

In LEDs used in the configuration of a light-emitting element, the quantum well structure has been used instead of a bulk active layer to improve light emission efficiency. Further, in LEDs, in addition to improvement of light emission efficiency in the active layer, a configuration in which a reflecting mirror is provided on the opposite side from the light emission side with respect to the active layer to increase a light emission amount extracted from the light emission side (light extraction efficiency) is known.

Accordingly, it may be expected that the light extraction efficiency is easily improved by applying a configuration of introducing a reflecting mirror used in LEDs to the light-emitting thyristor of Japanese Patent Application Laid-Open No. S63-196084 having the quantum well structure in order to improve the light extraction efficiency. However, the present inventors have found that, even with a reflecting mirror, more specifically, even with a semiconductor DBR layer used in an LED being merely provided between a semiconductor substrate and a device function layer in the configuration of Japanese Patent Application Laid-Open No. S63-196084, this does not result in significant improvement in the light extraction efficiency as much as in the LED. The semiconductor DBR layer forms a distributed Bragg reflector that reflects a light emitted by the light-emitting thyristor to the light emission side. Furthermore, the present inventors have found that, even if the problem of the light extraction efficiency is solved, a secondary problem occurs.

With respect to a semiconductor DBR layer, there are constraints in respective usable materials for the low refractive index layer and the high refractive index layer forming the semiconductor DBR layer. As a result, in a semiconductor DBR layer, a wavelength band of high reflectance, more specifically, a band exhibiting a reflectance exceeding 50% of the maximum value of reflectance (hereafter, referred to as a high reflection band) is limited. For example, the high reflection band is around 55 nm at the full width at half maximum in a 780 nm-wavelength band generally used for an image forming apparatus. On the other hand, when a thyristor with the light-emitting thyristor structure disclosed in Japanese Patent Application Laid-Open No. S63-196084 is turned on, the density of carriers accumulated in the active layer of the quantum well becomes high, and the band of light emission from the quantum well exceeds the high reflection band described above. As a result, out of light emitted to the semiconductor DBR side, the amount of reflected light is reduced. Furthermore, in a case of a light-emitting thyristor, attempt to solve this problem causes a new secondary problem of a significant increase of the operation voltage that does not occur in an LED or the like.

As described above, the fundamental cause of occurrence of a problem in a light-emitting thyristor that is different from the case of an LED is in a demand in the light-emitting thyristor for improving light emission efficiency and maintaining the function as a thyristor in the first place. Furthermore, this is because constraints not imposed on an LED are imposed on a light-emitting thyristor because an LED and a thyristor operate in different principles as an electronic device.

In the present embodiment, as described above, the number of quantum wells is set to 10 or greater, specifically, 25, and this realizes improvement of light emission efficiency of a light-emitting thyristor while maintaining the function as a thyristor.

Figure 1B:
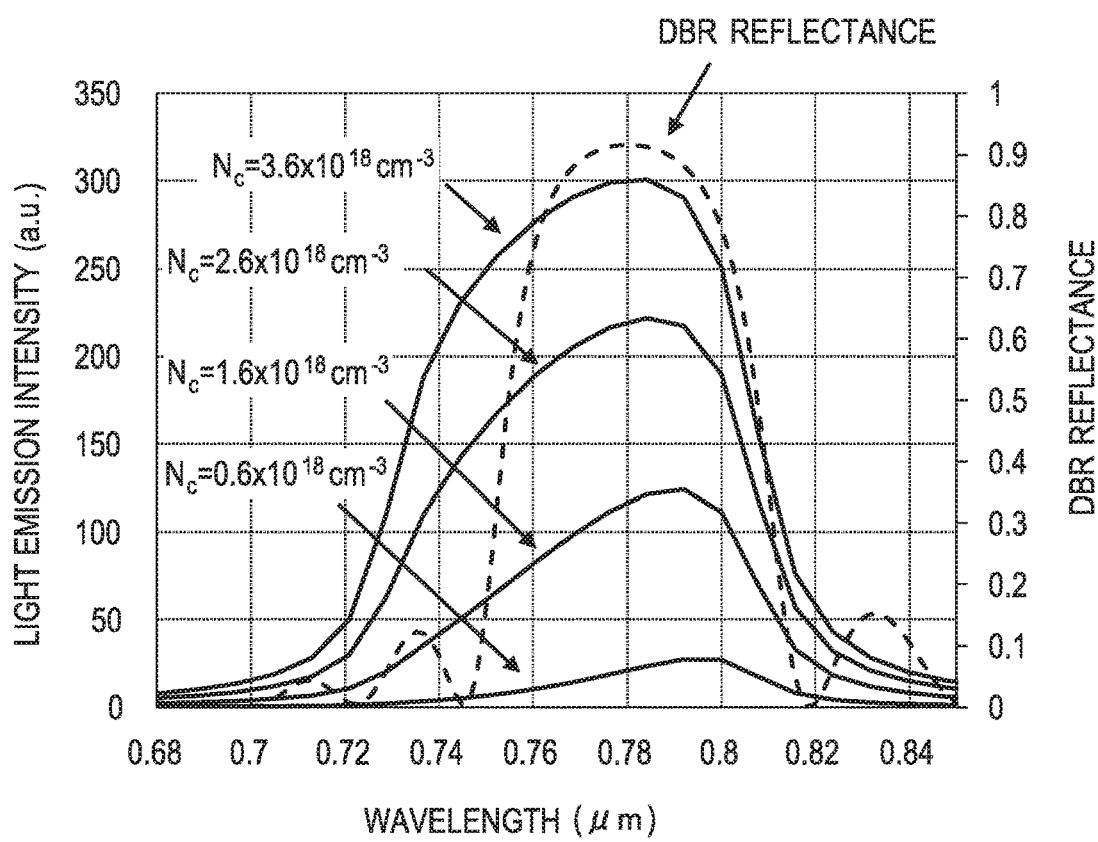
FIG. 1B is a graph illustrating a light emission spectrum in a quantum well in accordance with a density of carriers accumulated in a quantum well in a light-emitting thyristor and a reflection spectrum of a semiconductor DBR layer.

FIG. 1B illustrates a light emission spectrum in a quantum well in accordance with the density of carriers accumulated in a quantum well in a light-emitting thyristor and a reflection spectrum of the semiconductor DBR layer 160. In FIG. 1B, light emission spectra for different carrier densities $N_c$ are represented by solid line spectra, and a reflection spectrum indicating a reflectance (DBR reflectance) at the semiconductor DBR layer 160 is represented by a dashed line spectrum.

As illustrated in FIG. 1B, when the carrier density exceeds $2 \times 10^{18}$ $cm^{-3}$, the excess of the light emission spectrum out of the high reflection band of the semiconductor DBR layer 160 is significant. Thus, in a wavelength range where a light emission spectrum exceeds, the effect of reflection at the semiconductor DBR layer 160 significantly decreases, and as a result, a ratio of the light reflected by the semiconductor DBR layer 160 decreases.

Figure 1C:
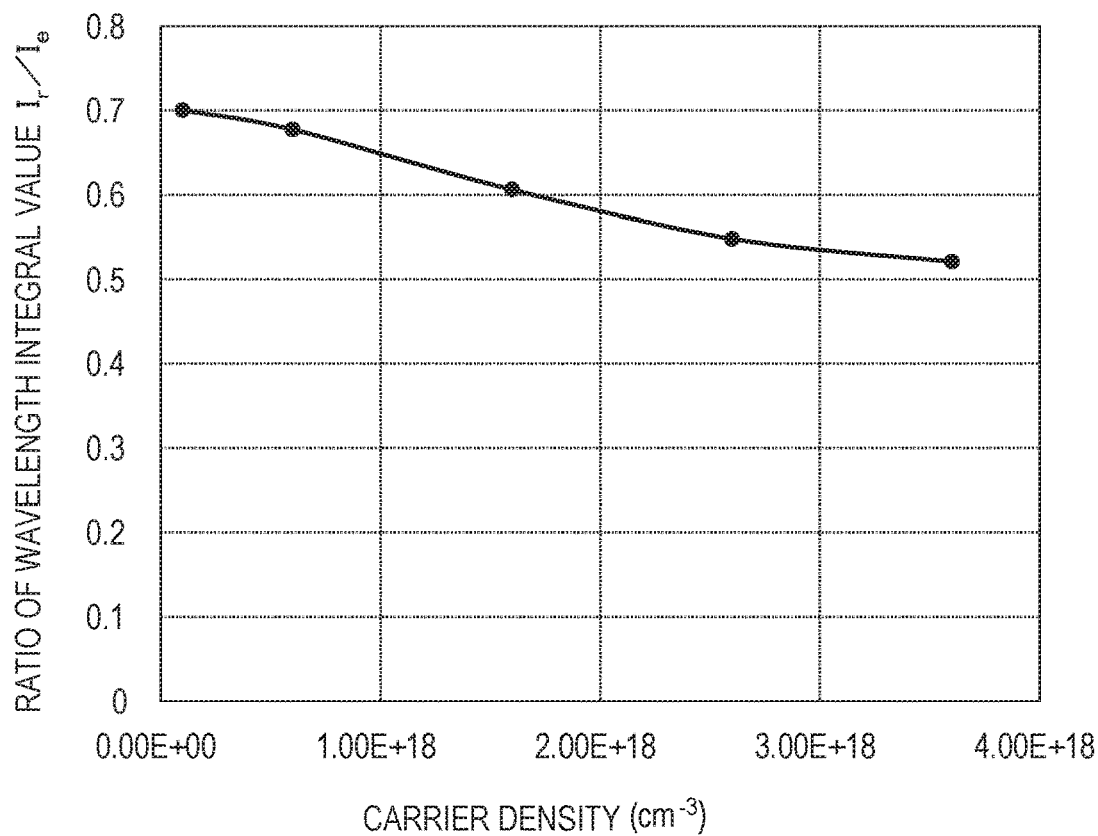
FIG. 1C is a graph illustrating a ratio of a wavelength integral value of a product of a reflectance and a light emission intensity of the semiconductor DBR layer at each wavelength relative to a wavelength integral value of a light emission intensity illustrated in FIG. 1B.

FIG. 1C illustrates a ratio $I_r/I_e$ of a wavelength integral value $I_r$ of a product of a reflectance and a light emission intensity of the semiconductor DBR layer 160 at each wavelength relative to a wavelength integral value $I_e$ of a light emission intensity illustrated in FIG. 1B. In the graph illustrated in FIG. 1C, the vertical axis represents the ratio $I_r/I_e$, and the horizontal axis represents the density of carriers accumulated in the MQW structure 161. The ratio $I_r/I_e$ represents a ratio of the amount of light reflected by the semiconductor DBR layer 160 out of light emitted from the MQW structure 161 to the semiconductor DBR layer 160. If the reflection spectrum of the semiconductor DBR layer 160 has no wavelength dependency and is at a certain constant value, the ratio $I_r/I_e$ is also the same constant value.

It can be seen from FIG. 1C that the ratio $I_r/I_e$ decreases as the carrier density increases. For example, while the wavelength integral value is 0.61 at the carrier density of $1.6 \times 10^{18}$ $cm^{-3}$, the wavelength integral value decreases to 0.55 at the carrier density of $2.6 \times 10^{18}$ $cm^{-3}$. That is, even with the same semiconductor DBR layer 160, the ratio of the amount of light reflected by the semiconductor DBR layer 160 decreases by 10%.

Figure 1D:
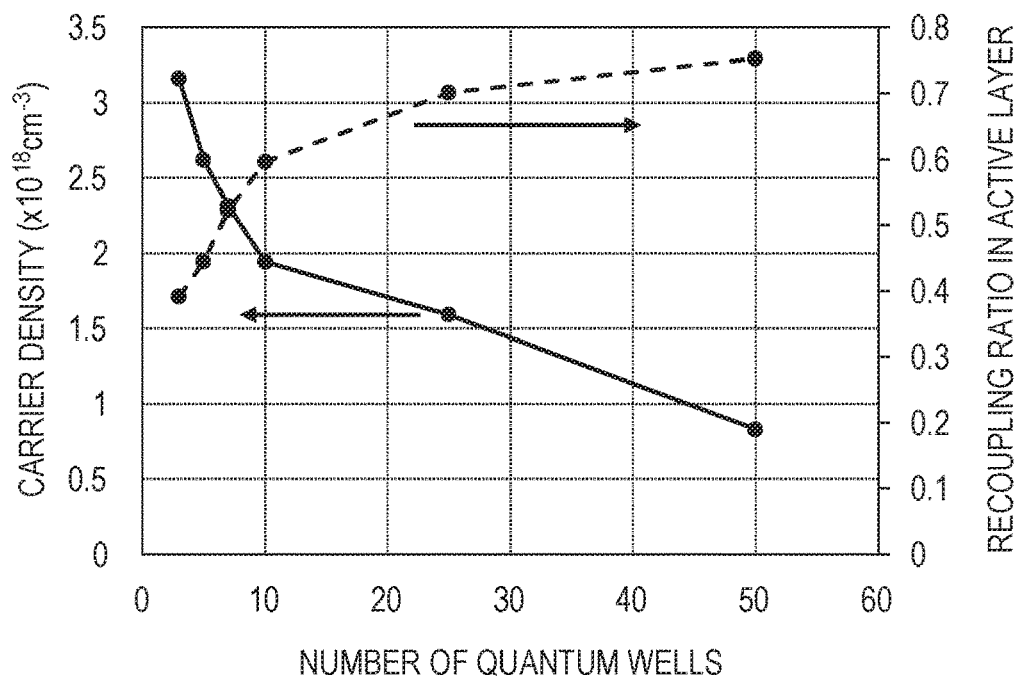
FIG. 1D is a graph illustrating a calculation result of dependency of a recoupling ratio in an active layer in a light-emitting thyristor and a density of carriers accumulated in a quantum well when the thyristor is turned on with respect to the number of quantum wells.

FIG. 1D illustrates a calculation result of dependency of a recoupling ratio in the quantum well layer 220, which is an active layer in a light-emitting thyristor, and a density of carriers accumulated in a quantum well when the thyristor is turned on with respect to the number of quantum wells. In the graph illustrated in FIG. 1D, the right vertical axis represents the recoupling ratio in the active layer, the left vertical axis represents the carrier density, and the horizontal axis represents the number of quantum wells. Further, the plot indicating the recoupling ratio is represented by a dashed line, and the plot indicating the carrier density is represented by a solid line. Herein, the recoupling ratio in the active layer means a ratio of the number of carriers recoupled in the active layer to the number of carriers recoupled in the p-base layer 102 and the n-gate layer 103 where carries are accumulated and conductivity modulation occurs when the thyristor is turned on. As a light-emitting element, it is desirable that the ratio be large as much as possible. However, conductivity modulation is required for turning on the thyristor, and to this end, carriers of the required number are required to be present in the overall p-base layer 102 and n-gate layer 103.

As seen from FIG. 1D, the carrier density is $2.31 \times 10^{18}$ cm$^{-3}$ at the number of quantum wells of 7 as disclosed in Japanese Patent Application Laid-Open No. S63-196084. On the other hand, the carrier density is $1.59 \times 10^{18}$ cm$^{-3}$ at the number of quantum wells of 25. It is understood that, if the number of quantum wells is less than 10, the change in the carrier density with respect to the number of quantum wells increases compared to the case where the number of quantum wells is greater than or equal to 10. The reason why quantum wells, the number of which is three times or greater the number of quantum wells of Japanese Patent Application Laid-Open No. S63-196084, are arranged in the present embodiment is to reduce the carrier density as illustrated in FIG. 1D. Another reason for increasing the number of quantum wells is to increase the recoupling ratio in the active layer. As the number of quantum wells increases, the ratio of recoupling (mainly light emission recoupling) in the active layer increases. That is, the ratio of light emission of an intended wavelength increases, and this also improves the light emission efficiency.

A calculation result using a simulation model will be further described below. Note that, as the calculation scheme in the simulation, the configuration of FIG. 1A is sectioned into small meshes in the stacking direction, and numerical analysis is performed on each of the meshes. Unlike an LED, a laser diode (LD), or a light-emitting transistor, even with the same voltage applied between the anode and the cathode, a thyristor takes two different states in accordance with the history of a current injected to the gate. Further, it is necessary to reproduce these two states also in calculation. Accordingly, to calculate these two states, a time evolution explicit method is used for solution in this calculation. Table 1 and Table 2 indicate calculation results for comparative examples that are different from the present embodiment.

Table 1 is a calculation result in a configuration in which the MQW structure of the number of quantum wells of 25 is arranged between the p-base layer and the n-gate layer. When the MQW structure is arranged between the p-base layer and the n-gate layer, this results in that the off-state of the thyristor cannot be maintained. That is, this case results in that, even in a state where no current flows in the gate, when a voltage is applied between the anode and the cathode, a current starts flowing in the thyristor, and the thyristor transitions to an on-state.

TABLE 1

| Number of quantum wells | 25 |
|---|---|
| Thyristor on/off operation | NG |
| Recoupling ratio in active layer | 0.68 |
| Carrier density ($\times 10^{18}$ cm$^{-3}$) | |

Table 2 is a calculation result in a configuration in which the MQW structure of the number of quantum wells of 25 is arranged inside the p-base layer. In this case, while the off-state can be maintained, the ratio of recoupling inside the active layer is 0.18. This value is a value 74% lower than 0.701 that is a value at the number of quantum wells of 25 illustrated in FIG. 1D. That is, this case means that carriers are recoupled outside the quantum well layer, and the ratio of light emission of an intended wavelength is reduced.

TABLE 2

| Number of quantum wells | 25 |
|---|---|
| Thyristor on/off operation | OK |
| Recoupling ratio in active layer | 0.18 |
| Carrier density ($\times 10^{18}$ cm$^{-3}$) | 1.89 |

From the calculation results illustrated in Table 1 and Table 2, it can be seen that it is preferable that the quantum well structure be arranged inside the n-gate layer rather than the p-base layer and the number of quantum wells be greater than or equal to 10 in the light-emitting thyristor to which the semiconductor DBR layer is introduced. Such constraints are the constraints specific to a light-emitting thyristor that are not imposed on an LED or the like.

In the present embodiment, since the MQW structure is arranged inside the n-gate layer 103 and the number of quantum wells is set to 10 or greater, it is possible to improve light emission efficiency of a light-emitting thyristor while maintaining the function as a thyristor.

Note that, with respect to a specific difference between a light-emitting thyristor and an LED, a configuration and characteristics of a general LED will be described below. In general, an LED is configured such that a quantum well structure is arranged between a p-type layer and an n-type layer, and light is efficiently emitted by injecting holes and electrons to both ends of the MQW structure, respectively. Also for a light emission ratio in the quantum well layer, a quantum well layer is arranged between a p-type layer and an n-type layer, and so-called double hetero structure is further employed for performing confinement in the quantum well layer as much as possible in an LED. In the double hetero structure, a bandgap to the outside of the quantum well structure is increased as much as possible, and therefore the recoupling ratio is a value close to 1.0 in the actual LED.

As described above, according to the present embodiment, it is possible to realize a light-emitting thyristor with improved light emission efficiency while maintaining the function as a thyristor.

Note that, although the MQW structure is used as a light-emitting layer inside the n-gate layer in the present embodiment, the embodiment is not limited thereto. Instead of the MQW structure, a quantum dot or the like may be used as an active layer having a light emission spectrum width that is the same as or a narrower than that of a quantum well. Also in such a case, design to provide the same advantageous effect as the present embodiment is possible. The same applies to other examples described below without being limited to the present embodiment.

Examples of the present invention will be described below in detail with illustration of specific layer configurations or the like of a light-emitting thyristor.

First Example

Figure 2:
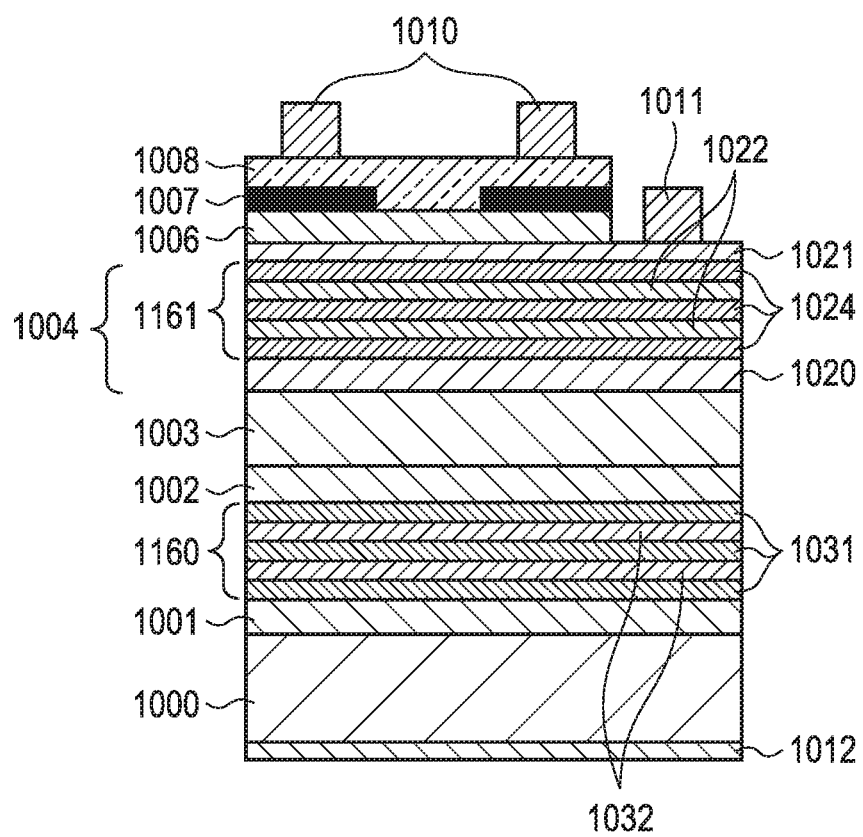
FIG. 2 is a sectional view schematically illustrating the structure of a light-emitting thyristor of a first example.

FIG. 2 is an element sectional view of a light-emitting thyristor of a first example. In the light-emitting thyristor of the present example, an n-type GaAs buffer layer 1001, a semiconductor DBR layer 1160, a cathode layer 1002, a p-base layer 1003, an n-gate layer 1004, and an anode layer 1006 are stacked in this order on an n-type GaAs substrate 1000. A current constriction portion 1007 in which an electrical opening (a region in which a conductivity is higher than the outer circumference portion of the opening) is partially provided is formed on the anode layer 1006. A transparent conductive layer 1008 that is transparent to a light emission wavelength is formed on the current constriction portion 1007. An anode electrode 1010 is formed on the transparent conductive layer 1008. The anode electrode 1010 is a ring electrode (flame-shape electrode) and is structured to extract a light emitted by the n-gate layer 1004 and the p-base layer 1003. Further, a gate electrode 1011 is arranged on the n-gate layer 1004. A cathode electrode 1012 is arranged on the backside of the GaAs substrate 1000.

The semiconductor DBR layer 1160 has a layered structure in which an n-type $Al_{0.2}GaAs$ layer 1032 and an n-type $Al_{0.8}GaAs$ layer 1031 are paired, both layers are alternatingly stacked, and 20 pairs thereof are stacked. The cathode layer 1002 is made of n-type $Al_{0.6}GaAs$. The p-base layer 1003 is made of p-type $Al_{0.31}GaAs$ and has a thickness of 700 nm and a carrier concentration of $2\times10^{17}$ cm$^{-3}$. The n-gate layer 1004 is formed of staked three layers of a spacer layer 1020, a MQW structure 1161, and a spacer layer 1021. The n-gate layer 1004 has a thickness of 350 nm. The spacer layer 1020 is made of n-type $Al_{0.31}GaAs$ and has a thickness of 100 nm and a carrier concentration of $2\times10^{17}$ cm$^3$. The MQW structure 1161 has a light emission wavelength at the ground state of 780 nm and has quantum well layers 1024 and barrier layers 1022 interposing each quantum well layer 1024 in which the bandgap difference $\Delta E_g$ between both the layers is 0.21 eV. Each of the barrier layer 1022 and the quantum well layer 1024 is formed of an AlGaAs-based material. The thickness of the quantum well layer 1024 is 6 nm. The number of quantum wells of the MQW structure 1161 is 25. The spacer layer 1021 is made of n-type $Al_{0.31}GaAs$ and has a carrier concentration of $2\times10^{17}$ cm$^{-3}$ and a thickness of 95 nm. The anode layer 1006 is made of p-type $Al_{0.4}GaAs$.

As described above, a current constriction portion 1007 in which an electrical opening is partially provided is formed on the anode layer 1006, and a transparent conductive layer 1008 that is transparent to a light emission wavelength is formed thereon. This structure causes a current to mainly flow inside the opening of the current constriction portion 1007, and a current constriction function is realized. In the present invention, however, the current constriction function is not required to be limited to the current constriction structure of the present example. For example, the advantageous effect of the present invention can be obtained also by using an oxidization constriction structure illustrated in a third example described later or the like.

In the present example, the thyristor can be turned on by causing a current to flow in the gate electrode 1011 in a state where a voltage of 10 V is applied between the anode electrode 1010 and the cathode electrode 1012 by a peripheral circuit (not illustrated).

According to the configuration of the present example, the wavelength band of a light emitted by the quantum well layer 1024 is included at a larger ratio in a high reflection band of a reflectance spectrum of the semiconductor DBR layer 1160. Therefore, according to the configuration of the present example, it is possible to realize a light-emitting thyristor with improved light emission efficiency while maintaining the function as a thyristor.

Second Example

Figure 3:
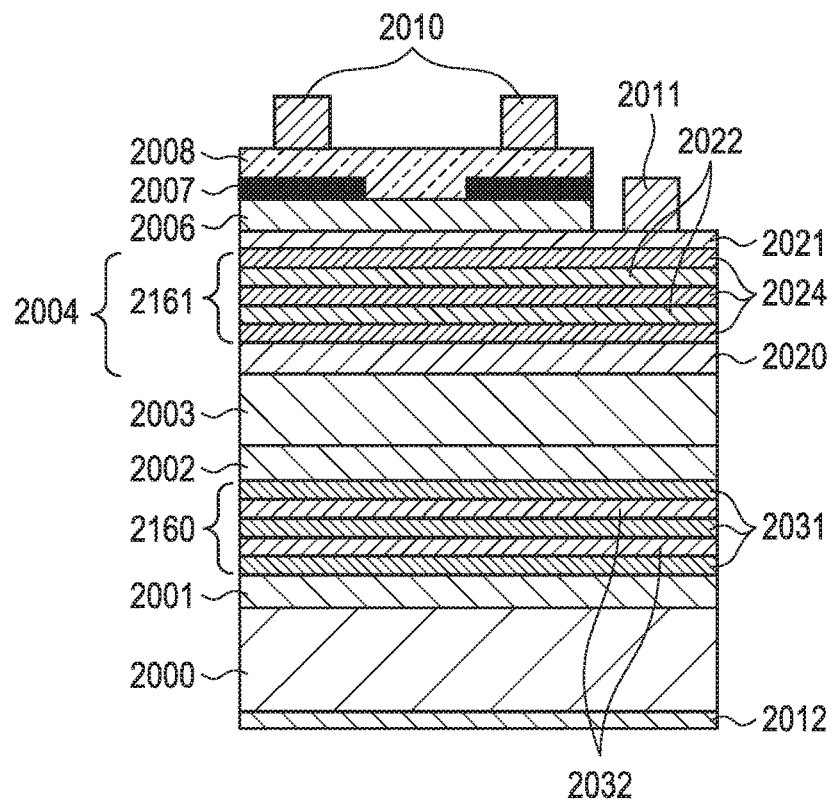
FIG. 3 is a sectional view schematically illustrating the structure of a light-emitting thyristor of a second example.

FIG. 3 is an element sectional view of a light-emitting thyristor of a second example. In the light-emitting thyristor of the present example, an n-type GaAs buffer layer 2001, a semiconductor DBR layer 2160, a cathode layer 2002, a p-base layer 2003, an n-gate layer 2004, and an anode layer 2006 are stacked in this order on an n-type GaAs substrate 2000. A current constriction portion 2007 in which an electrical opening (a region in which a conductivity is higher than the outer circumference portion of the opening) is partially provided is formed on the anode layer 2006. A transparent conductive layer 2008 that is transparent to a light emission wavelength is formed on the current constriction portion 2007. An anode electrode 2010 is formed on the transparent conductive layer 2008. The anode electrode 2010 is a ring electrode (flame-shape electrode) and is structured to extract a light emitted by the n-gate layer 2004 and the p-base layer 2003. Further, a gate electrode 2011 is arranged on the n-gate layer 2004. A cathode electrode 2012 is arranged on the backside of the GaAs substrate 2000.

The semiconductor DBR layer 2160 has a layered structure in which an n-type $Al_{0.2}GaAs$ layer 2032 and an n-type $Al_{0.8}GaAs$ layer 2031 are paired, both layers are alternatingly stacked, and 20 pairs thereof are stacked. The cathode layer 2002 is made of n-type $Al_{0.6}GaAs$. The p-base layer 2003 is made of p-type $Al_{0.23}GaAs$ and has a thickness of 700 nm and a carrier concentration of $2\times10^{17}$ cm$^{-3}$. The n-gate layer 2004 is formed of staked three layers of a spacer layer 2020, a MQW structure 2161, and a spacer layer 2021. The n-gate layer 2004 has a thickness of 350 nm. The spacer layer 2020 is made of n-type $Al_{0.23}GaAs$ and has a thickness of 100 nm and a carrier concentration of $2\times10^{17}$ cm$^{-3}$. The MQW structure 2161 has a light emission wavelength at the ground state of 780 nm, has quantum well layers 2024 and barrier layers 2022 in which the bandgap difference $\Delta E_g$ between both the layers is 0.105 eV, and is non-doped. Each of the barrier layer 2022 and the quantum well layer 2024 is formed of an AlGaAs-based material. The thickness of the quantum well layer 2024 is 6 nm. The number of quantum wells of the MQW structure 2161 is 15. The spacer layer 2021 is made of n-type $Al_{0.23}GaAs$ and has a carrier concentration of $2\times10^{17}$ cm$^{-3}$ and a thickness of 95 nm. The anode layer 2006 is made of p-type $Al_{0.4}GaAs$.

In the present example, the bandgap difference $\Delta E_g$ between the quantum well layers 2024 and the barrier layers 2022 interposing the quantum well layer 2024 is smaller than that of the first example. This is to solve a secondary problem occurring due to the increased number of quantum wells described in the above embodiment. The secondary problem is an increase of the operation voltage, that is, an increase of a voltage required to maintain an on-state of a thyristor.

Table 3 illustrates a result of calculation as to whether or not an on-state of a thyristor can be maintained by the anode-cathode voltage $V_{AK}$ indicated in Table 3 when the bandgap difference $\Delta E_g$ between the quantum well layer and the barrier layer disclosed in Japanese Patent Application Laid-Open No. S63-196084 is 0.21 eV and the number of quantum wells is 7 and 25. The anode-cathode voltage $V_{AK}$ is a drive voltage of a light-emitting thyristor. In Table 3, "OK" indicates that the on-state of the thyristor was maintained, and "NG" indicates that the on-state of the thyristor was not maintained.

TABLE 3

| Number of quantum wells | Anode-cathode voltage $V_{AK}$(V) | | | |
|---|---|---|---|---|
| | 2.5 | 5.0 | 7.5 | 10.0 |
| 7 | NG | OK | OK | OK |
| 25 | NG | NG | OK | OK |

From the calculation result illustrated in Table. 3, it can be seen that, when the number of quantum wells is increased from 7 to 25, the voltage required to maintain the on-state of the thyristor is increased. The reason for this is as follows. That is, to generate conductivity modulation in a thyristor, a certain carrier concentration is required to be maintained inside the p-base layer and the n-gate layer. On the other hand, since the number of carriers recoupled in the quantum well layer increases when the number of quantum wells increases, more current is required to maintain the carrier density at a certain level, and this requires a higher voltage to be applied. In such a way, the voltage required to maintain the on-state of the thyristor will increase.

Table 4 illustrates a result of calculation as to whether or not the on-state can be maintained when a current of 1 mA is supplied to the gate and the gate current is then reduced to zero with respect to configurations with various bandgap differences $\Delta E_g$ between the quantum well layer and the barrier layer for different anode-cathode voltage $V_{AK}$. In Table 4, "OK" indicates that the on-state was maintained, and "NG" indicates that the on-state was not maintained.

TABLE 4

| | Anode-cathode voltage $V_{AK}$(V) | | |
|---|---|---|---|
| $\Delta Eg$(eV) | 10 | 2.5 | 2 |
| 0.21 | OK | NG | NG |
| 0.15 | OK | OK | NG |
| 0.105 | OK | OK | OK |
| 0.05 | OK | OK | OK |

From a calculation result indicated in Table 4, it can be seen that, for $\Delta E_g$=0.21 eV, the on-state is maintained at 10 V but is not maintained at 2.5 V. On the other hand, it can be seen that, for $\Delta E_g$=0.15 eV, the on-state is maintained even at 2.5 V.

Table 5-1 and Table 5-2 indicate results of calculation as to whether or not the on-state of a thyristor can be maintained when the number of quantum wells is changed in respective conditions of $V_{AK}$=2.0 V and 2.5 V and $\Delta E_g$=0.05 eV, 0.105 eV, and 0.15 eV. Table 5-1 indicates a calculation result in a case of $V_{AK}$=2.0 V. Table 5-2 indicates a calculation result in a case of $V_{AK}$=2.5 V. In Tables 5-1 and 5-2, "OK" indicates that the on-state was maintained, and "NG" indicates that the on-state was not maintained. Note that calculation is made for the number of quantum wells of 10, 25, 50, 75, and 100.

TABLE 5-1

| | Number of quantum wells | | | | @$V_{AK}$ = 2.0 V |
|---|---|---|---|---|---|
| $\Delta Eg$(eV) | 10 | 25 | 50 | 75 | 100 |
| 0.05 | OK | OK | OK | OK | OK |
| 0.105 | OK | OK | OK | NG | NG |
| 0.15 | OK | NG | NG | NG | NG |

TABLE 5-2

| | Number of quantum wells | | | | @$V_{AK}$ = 2.5 V |
|---|---|---|---|---|---|
| $\Delta Eg$(eV) | 10 | 25 | 50 | 75 | 100 |
| 0.05 | OK | OK | OK | OK | OK |
| 0.105 | OK | OK | OK | OK | NG |
| 0.15 | OK | OK | OK | NG | NG |

From the calculation result illustrated in Table 5-2, it can be seen that, at $V_{AK}$=2.5 V, the on-state can be maintained at up to the number of quantum wells of 50 for $\Delta E_g$=0.15 eV, up to the number of quantum wells of 75 for $\Delta E_g$=0.105 eV, and up to the number of quantum wells of 100 for $\Delta E_g$=0.05 eV. Furthermore, from the calculation result illustrated in Table 5-1, it can be seen that, at $V_{AK}$=2.0 V, the on-state can be maintained at up to the number of quantum wells of 50 for $\Delta E_g$=0.105 eV, but the on-state can be maintained only at the number of quantum wells of 10 for $\Delta E_g$=0.15 eV.

For example, operating a light-emitting thyristor at $V_{AK}$=7.5 V means that it is necessary to externally apply a voltage of 7.5 V or higher. On the other hand, in general, low voltage operation is preferable for electronic devices, and a preferable voltage applied to a chip including a light-emitting thyristor may be, for example, 5.0 V, 3.3 V, or the like. Thus, it is preferable that $V_{AK}$ be at least lower than or equal to the above voltage.

That is, the following points can be understood from the calculation results indicated from Table 3 to Table 5-2. That is, there is not only a lower limit but also an upper limit in the number of quantum wells when an operation is intended at a preferable voltage lower than or equal to 5 V. Furthermore, it is preferable that $\Delta E_g$ be also within a particular range.

Specifically, for operation at $V_{AK}$=2.5 V, it is preferable that $\Delta E_g$ be less than or equal to 0.15 eV and the number of quantum wells be less than or equal to 50. Further, if $\Delta E_g$ is less than or equal to 0.105 eV, it is preferable that the number of quantum wells be less than or equal to 75.

As discussed above, the number of quantum wells of the MQW structure 2161 is preferably set in accordance with the bandgap difference $\Delta E_g$, and more preferably set in accordance with the bandgap difference $\Delta E_g$ and the anode-cathode voltage $V_{AK}$ that is a drive voltage.

In LEDs, as described above, it is general to employ design in which $\Delta E_g$ is increased as much as possible within a range of constraints for a usable semiconductor material under a design concept of the double hetero structure. This is to confine carriers in a quantum well as much as possible and cause natural recoupling efficiently. On the other hand, in terms of an operation voltage, even an increased $\Delta E_g$ does not affect the operation voltage.

On the other hand, in light-emitting thyristors, there is a demand for efficient light emission and operation as a thyristor. Furthermore, when a semiconductor DBR layer is introduced in a light-emitting thyristor to increase light extraction efficiency, there is a lower limit value in the number of quantum well due to limitation of a high reflection band of the semiconductor DBR layer as described above. Furthermore, in a light-emitting thyristor, the MQW structure is required to be arranged at a position that is different from the case of an LED. Furthermore, in a light-emitting thyristor, to realize a thyristor operation at a preferable voltage, the number of quantum wells has an upper limit value, $\Delta E_g$ is preferably within a particular range, and excessive number and $\Delta E_g$ are not preferable, respectively.

In the present example, with $\Delta E_g$ being 0.105 eV and the number of quantum wells being 15 as an example of values for achieving both of the above, an on-state of a thyristor can be maintained even when $V_{AK}$ is 2.0 V.

As described above, according to the configuration of the present example, it is possible to realize a light-emitting thyristor with improved light emission efficiency while maintaining the function as a thyristor.

Third Example

Figure 4:
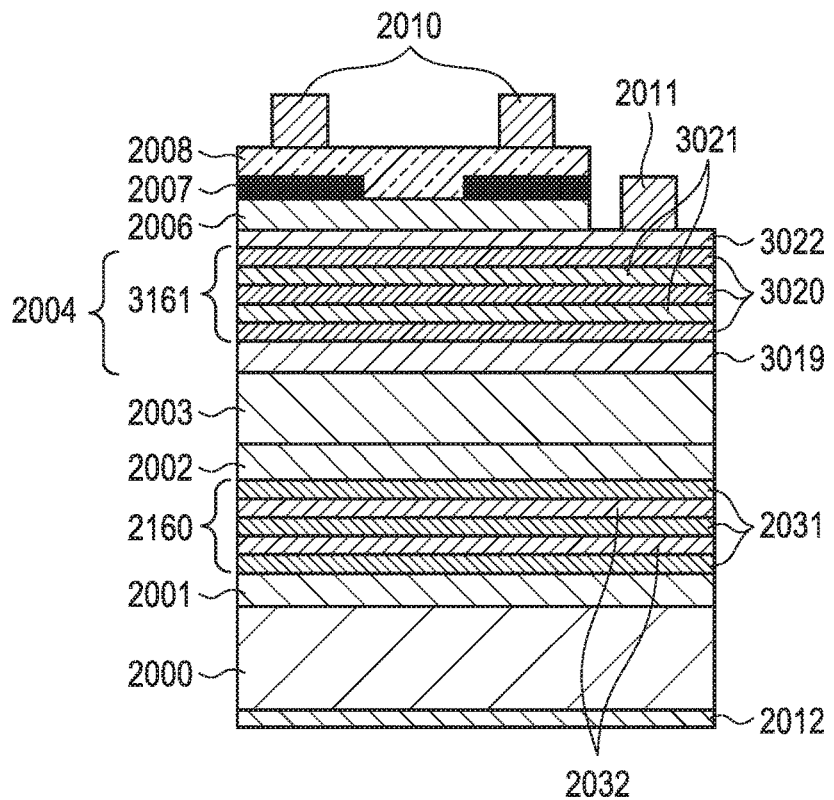
FIG. 4 is a sectional view schematically illustrating the structure of a light-emitting thyristor of a third example.

FIG. 4 is an element sectional view of a light-emitting thyristor of a third example. Note that, since the configuration of the present example is similar to the configuration of the second example, the same members as those of the second example are labeled with the same references, and the description thereof will be omitted or simplified in the present example.

In the light-emitting thyristor of the present example, the n-type GaAs buffer layer 2001, the semiconductor DBR layer 2160, the cathode layer 2002, the p-base layer 2003, the n-gate layer 2004, and the anode layer 2006 are stacked in this order on the n-type GaAs substrate 2000. Further, the anode electrode 2010 is formed on the anode layer 2006 via the current constriction portion 2007 and the transparent conductive layer 2008. The anode electrode 2010 is a ring electrode (flame-shape electrode) and is structured to extract a light emitted by the n-gate layer 2004 and the p-base layer 2003. Further, the gate electrode 2011 is arranged on the n-gate layer 2004. The cathode electrode 2012 is arranged on the backside of the GaAs substrate 2000.

The cathode layer 2002 is made of n-type $Al_{0.6}GaAs$. The p-base layer 2003 is made of p-type $Al_{0.23}GaAs$ and has a thickness of 700 nm and a carrier concentration of $2\times10^{17}$ $cm^{-3}$. The n-gate layer 2004 is formed of staked three layers of a spacer layer 3019, a MQW structure 3161, and a spacer layer 3022. The spacer layer 3019 is made of n-type $Al_{0.23}GaAs$ and has a thickness of 30 nm and a carrier concentration of $2\times10^{17}$ $cm^{-3}$. The MQW structure 3161 has a light emission wavelength at the ground state of 780 nm, has quantum well layers 3020 and barrier layers 3021 interposing the quantum well layer 3020, and the bandgap difference $\Delta E_g$ between both the layers is 0.105 eV. Each of the barrier layer 3021 and the quantum well layer 3020 is formed of an AlGaAs-based material. The thickness of the quantum well layer 3020 is 6 nm. The number of quantum wells of the MQW structure 3161 is 25, and the whole MQW structure 3161 is doped at $2\times10^{17}$ $cm^{-3}$. The spacer layer 3022 is made of n-type $Al_{0.23}GaAs$ and has a carrier concentration of $2\times10^{17}$ $cm^{-3}$ and a thickness of 30 nm.

The present example is different from the second example in that the doped MQW structure 3161 is interposed between the spacer layers 3019 and 3022 that are semiconductor layers of the same conductivity type.

In an LED or a semiconductor laser, an active layer formed of a quantum well or the like is arranged in a portion interposed between a p-type layer and an n-type layer, and holes and electros are injected to both sides, respectively. Thus, a part where both carriers are present the most is located at the portion interposed between a p-type layer and an n-type layer. Thus, as a result, an active layer is arranged between the p-type layer and the n-type layer as described above, and efficient light emission is designed.

On the other hand, in a case of a light-emitting thyristor, even when a quantum well layer is doped and a MQW structure is provided inside the doped layer having a thickness of 350 nm, carries including holes can be accumulated, and the same high light emission efficiency as that of the second example can be maintained. This is because, unlike an LED, a thyristor transitions to a state in an on-state where conductivity modulation is caused in the gate layer and the base layer, carriers of both of holes and electrons are thereby accumulated, and thus both carriers can be accumulated even when a quantum well layer is provided inside the n-gate layer. In such a way, in a light-emitting thyristor, by designing the position of an active layer or the like based on a design concept that is different from the case of an LED or a semiconductor laser, it is possible to optimize a thyristor characteristic and a light emission characteristic.

As described above, according to the configuration of the present example, it is possible to realize a light-emitting thyristor with improved light emission efficiency while maintaining the function as a thyristor.

Fourth Example

Figure 5:
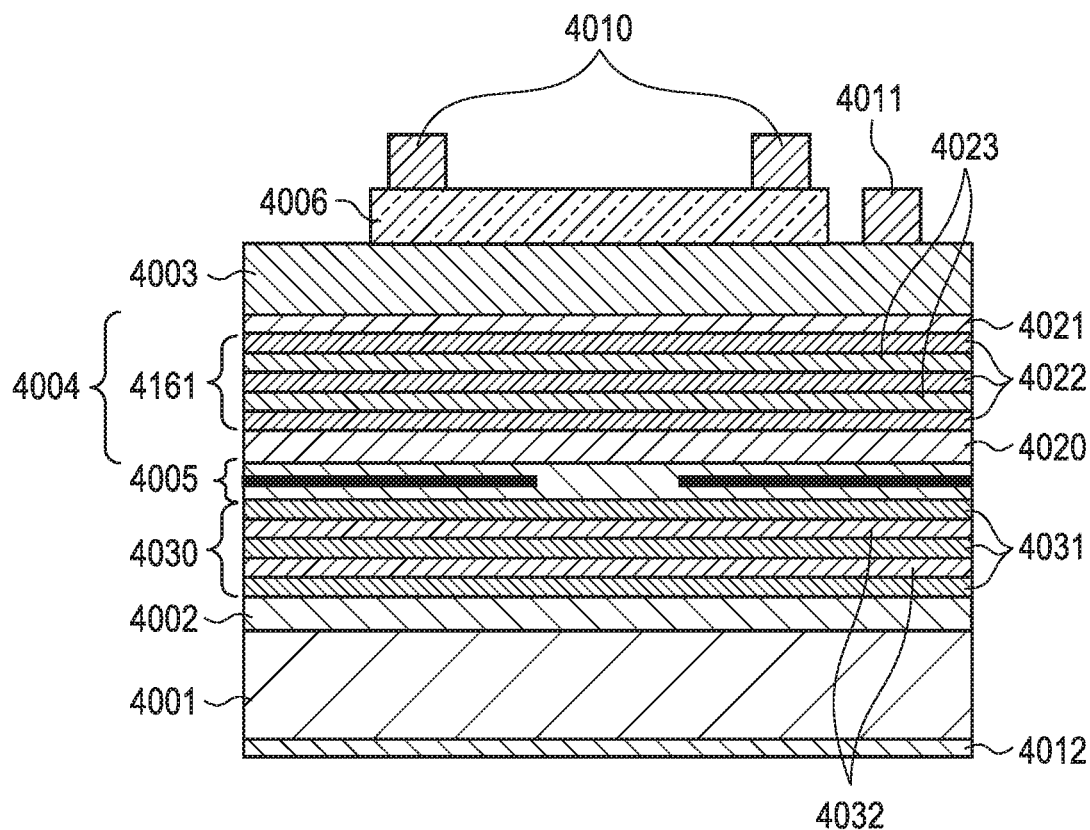
FIG. 5 is a sectional view schematically illustrating the structure of a light-emitting thyristor of a fourth example.

FIG. 5 is an element sectional view of a light-emitting thyristor of a fourth example. In the present example, a p-type GaAs substrate is used as a semiconductor substrate. Thus, the present example is different from the above first to third examples in the order of stacked layers, the type of conductivity type of some layers, or the like.

In the light-emitting thyristor of the present example, a p-type GaAs buffer layer 4002, a p-type semiconductor DBR layer 4030, a current constriction layer 4005, an n-base layer 4004, a p-gate layer 4003, and a cathode layer 4006 are stacked in this order on a p-type GaAs substrate 4001. The current constriction layer 4005 also functions as an anode layer. A cathode electrode 4010 is formed on the cathode layer 4006. A gate electrode 4011 is formed on the p-gate layer 4003. Further, an anode electrode 4012 is arranged on the backside of the GaAs substrate 4001.

In the present example, a layered structure having a p-type first semiconductor layer (anode layer), a second semiconductor layer (n-base layer), a p-type third semiconductor layer (p-gate layer), and an n-type fourth semiconductor layer (cathode layer) in this order is formed on a semiconductor substrate. Further, in the present example, at least a part of the second semiconductor layer (n-base layer) is the n-type, an n-type or i-type MQW structure is provided, and a plurality of n-type fifth semiconductor layers (spacer layer) are provided. The fifth semiconductor layer is not necessarily required to have multiple layers, and at least one fifth semiconductor layer (spacer layer) is present between the first semiconductor layer (anode layer) and the MQW structure.

In the semiconductor DBR layer 4030, low refractive index layers 4031 made of p-type $Al_{0.8}GaAs$ and high refractive index layers 4032 made of p-type $Al_{0.3}GaAs$ are alternatingly stacked. The optical film thickness (optical thickness) of each layer of the low refractive index layers 4031 and the high refractive index layers 4032 is one-fourth of the light emission wavelength of 780 nm of the light-emitting thyristor. Since the lower refractive index layer 4031 and the high refractive index layer 4032 have different refractive indices, both the layers have the same optical film thickness of one-fourth of 780 nm but have different actual film thicknesses. The low refractive index layers 4031 include 16 layers, and the high refractive index layers 4032 include 15 layers. The doping concentration of the semiconductor DBR layer 4030 is even and is $1\times10^{18}$ $cm^3$.

The current constriction layer 4005 is made of p-type $Al_{0.98}GaAs$ and structured so that current flows in only a part of the center due to oxidation from the horizontal direction. Thereby, current can be concentrated to the center part. The current constriction layer 4005 also functions as an anode layer.

The n-base layer 4004 on the current constriction layer 4005 is configured such that the spacer layer 4020, the MQW structure 4161 in which 15 quantum well layers 4022 and 14 barrier layers 4023 are alternatingly stacked, and the spacer layer 4021 are stacked in this order. The barrier layer 4023 is made of $Al_{0.23}GaAs$. On the other hand, the quantum well layer 4022 is structured in so-called quantum well structure having a thickness of 8 nm, and the light emission wavelength of the ground state is 780 nm. The MQW structure 4161 is interposed between the spacer layer 4020 and the spacer layer 4021. The spacer layer 4020 is made of n-type $Al_{0.23}GaAs$ and has a thickness of 100 nm and a carrier concentration of $2\times10^{17}$ cm$^{-3}$. The spacer layer 4021 is made of n-type $Al_{0.23}GaAs$ and has a thickness of 50 nm and a carrier concentration of $2\times10^{17}$ cm$^{-3}$.

In the present example, in the configuration of semiconductor layers forming a light-emitting thyristor, an n-type semiconductor layer (the cathode layer 4006) is arranged between the p-gate layer 4003 that functions as a light-emitting layer and an upper electrode (the cathode electrode 4010). Such a configuration enables current injected from the upper electrode (the cathode electrode 4010) to flow in the horizontal direction (the direction from a part directly under the electrode to the element center) in the n-type semiconductor layer (the cathode layer 4006). In general, since mobility of carriers is higher in an n-type semiconductor than in a p-type semiconductor, the resistance of current flowing in the horizontal direction can be reduced. Thereby, evenness of light emission when the light-emitting thyristor is viewed from the above can also be improved. On the other hand, when an n-type substrate is used as a semiconductor substrate, since a thyristor has p-n-p-n structure, the uppermost part is of the p-type, and the advantageous effect obtained when the n-type semiconductor substrate described above is used as the uppermost layer is not obtained.

As with the present example, the light-emitting thyristor can be formed by using a p-type semiconductor substrate. Also in the present example, the number of quantum wells of the MQW structure 4161 can be set in the same manner as in the first to third examples.

Note that, although the p-type GaAs substrate is used in the present example, the conductivity type of each semiconductor layer forming the light-emitting thyristor of the present example can be changed to the opposite type. Specifically, the expression "the conductivity type is changed to the opposite type" as used herein means that the p-type GaAs substrate is changed to an n-type GaAs substrate, each p-type layer above the substrate is replaced with the n-type, and each n-type layer is replaced with the p-type.

Further, although the n-type GaAs substrate is used in the first to third examples, with the conductivity type of each semiconductor layer forming the light-emitting thyristor described in each example being changed to the opposite type, modification for a configuration in which the fourth semiconductor layer is the n-type semiconductor layer is possible as with the fourth example. Specifically, the expression "the conductivity type is changed to the opposite type" as used herein means that the n-type GaAs substrate is changed to a p-type GaAs substrate, each n-type layer above the substrate is replaced with the p-type, and each p-type layer is replaced with the n-type. With such a configuration, the uppermost layer of the semiconductor layered structure can be the n-type, and the same advantageous effect as that of the fourth example can be obtained.

Fifth Example

The present example relates to an electrophotographic system (image forming apparatus) using the light-emitting thyristor of the second example. Note that, instead of the light-emitting thyristor of the second example, the light-emitting thyristor of any of the first, third, and fourth examples may be used to configure an electrophotographic system as with the present example.

Figure 6A:
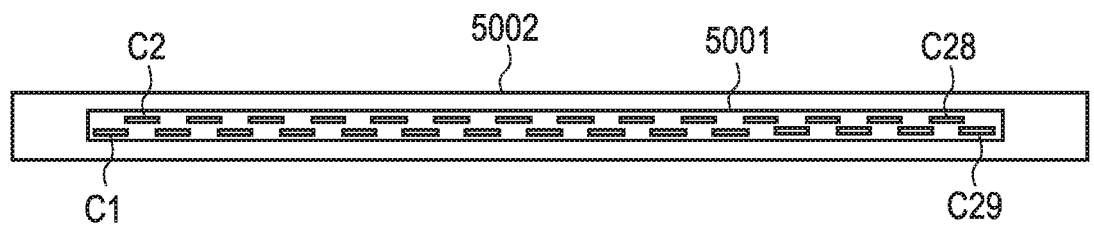
FIG. 6A is a diagram schematically illustrating the structure of a printed circuit board on which a light-emitting element array chip group of a fifth example is arranged.
Figure 6B:
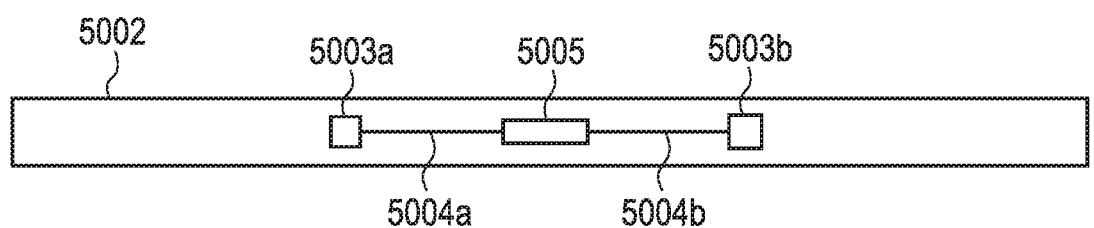
FIG. 6B is a diagram schematically illustrating the structure of the printed circuit board on which the light-emitting element array chip group of the fifth example is arranged.

FIG. 6A, FIG. 6B, and FIG. 6C are diagrams schematically illustrating a printed circuit board 5002 on which a surface light-emitting element array chip group 5001 is mounted. FIG. 6A is a diagram illustrating a face of the printed circuit board 5002 on which the surface light-emitting element array chip group 5001 is mounted (hereinafter, referred to as "surface light-emitting element array mounting face"). FIG. 6B is a diagram illustrating a face of the printed circuit board 5002 that is a face opposite to the surface light-emitting element array mounting face (hereinafter, referred to as "surface light-emitting element array non-mounting face").

As illustrated in FIG. 6A, the surface light-emitting element array chip group 5001 is formed of 29 surface light-emitting element array chips C1 to C29 in the present example. The surface light-emitting element array chip group 5001 is mounted on the surface light-emitting element array mounting face of the printed circuit board 5002. The surface light-emitting element array chips C1 to C29 are arranged in two lines in a staggered manner on the printed circuit board 5002. Each line of the surface light-emitting element array chips C1 to C29 is arranged along the longitudinal direction of the printed circuit board 5002.

Each of the surface light-emitting element array chips C1 to C29 has 516 light-emitting points and has 516 light-emitting thyristors corresponding to respective light-emitting points. Each of the light-emitting thyristors has the structure of the second example. In each of the surface light-emitting element array chips C1 to C29, the 516 light-emitting thyristors are aligned one-dimensionally at a predetermined pitch in the longitudinal direction of the chip. Adjacent light-emitting thyristors are isolated by an element isolation groove. That is, the surface light-emitting element array chips C1 to C29 can be referred to as a light-emitting thyristor array in which a plurality of light-emitting thyristors are aligned one-dimensionally. In this example, the pitch between adjacent light-emitting thyristors is 21.16 μm, which corresponds to the pitch of resolution of 1200 dpi. Further, the distance between both ends of the 516 light-emitting points in the chip is around 10.9 mm ($\approx$=21.16 μm×516).

As illustrated in FIG. 6B, a drive unit 5003a that drives the surface light-emitting element array chips C1 to C15 and a drive unit 5003b that drives the surface light-emitting element array chips C16 to C29 are arranged on both sides of a connector 5005 on the surface light-emitting element array non-mounting face. Signal lines that control the drive units 5003a and 5003b from an image controller unit 5415 (not illustrated), a power source, and a ground line are connected to the connector 5005. Further, the drive units 5003a and 5003b on the surface light-emitting element array non-mounting face are connected to the connector 5005 via wirings 5004a and 5004b, respectively. Wirings used for driving the surface light-emitting element array chips pass through an internal layer of the printed circuit board 5002 from the drive units 5003a and 5003b and are connected to the surface light-emitting element array chips C1 to C15 and the surface light-emitting element array chips C16 to C29, respectively.

FIG. 6C illustrates a view of the boundary part between the surface light-emitting element array chip C28 and the surface light-emitting element array chip C29. Wire bonding pads 5040 and 5050 used for inputting control signals are arranged at the ends of the surface light-emitting element array chips C28 and C29, respectively. Transfer units 5042 and 5052 of the surface light-emitting element array chips C28 and C29 and the light-emitting thyristors 5041 and 5051 are driven by signals input from the wire bonding pads 5040 and 5050, respectively. Also in the boundary part between the surface light-emitting element array chips, the pitch in the longitudinal direction of the light-emitting thyristors 5041 and 5051 is 21.16 μm corresponding to the pitch of resolution of 1200 dpi.

Since the 29 surface light-emitting element array chips C1 to C29 having 516 light-emitting points per chip are aligned on the printed circuit board 5002, the number of light-emitting thyristors that can be caused to emit light is 14,964 in the overall surface light-emitting element array chip group 5001. Further, the width where exposure is made by the surface light-emitting element array chip group 5001 of this example is around 316 mm (≅1.09 mm×29). With a use of the exposure head on which the surface light-emitting element array chip group 5001 is mounted, it is possible to form an image corresponding to such a width.

Next, an exposure head 5106 on which the surface light-emitting element array chip group 5001 described above is mounted will be described. The exposure head 5106 of the present example can be preferably used when exposure is performed on the photosensitive drum 5102 and an electrostatic latent image is formed on the photosensitive drum 5102. However, a use of the exposure head 5106 is not particularly limited, and the exposure head 5106 may be used as a light source of a line scanner, for example.

The exposure head 5106 has the surface light-emitting element array chip group 5001, the printed circuit board 5002 on which the surface light-emitting element array chip group 5001 is implemented, and a rod lens array 5203. Further, the exposure head 5106 has a housing (support member) 5204 that supports the rod lens array 5203 and the printed circuit board 5002.

The rod lens array 5203 is an optical system that collects light from the surface light-emitting element array chip group 5001. The exposure head 5106 collects a light from each light-emitting thyristor of the surface light-emitting element array chip group 5001 onto the rod lens array 5203. The light collected by rod lens array 5203 is emitted on the photosensitive drum 5102.

Figure 7A:
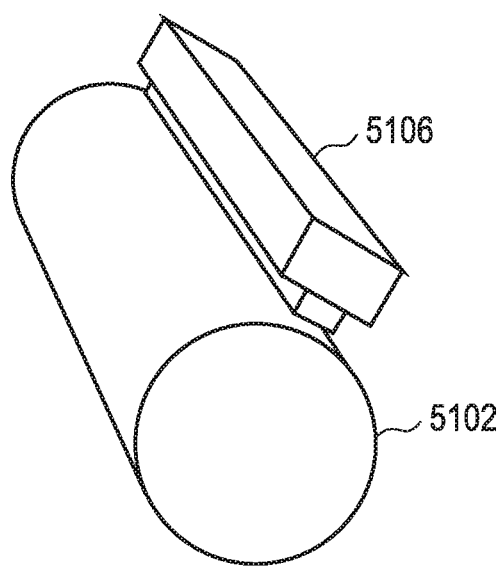
FIG. 7A is a diagram illustrating the configuration of an exposure head of the fifth example.
Figure 7B:
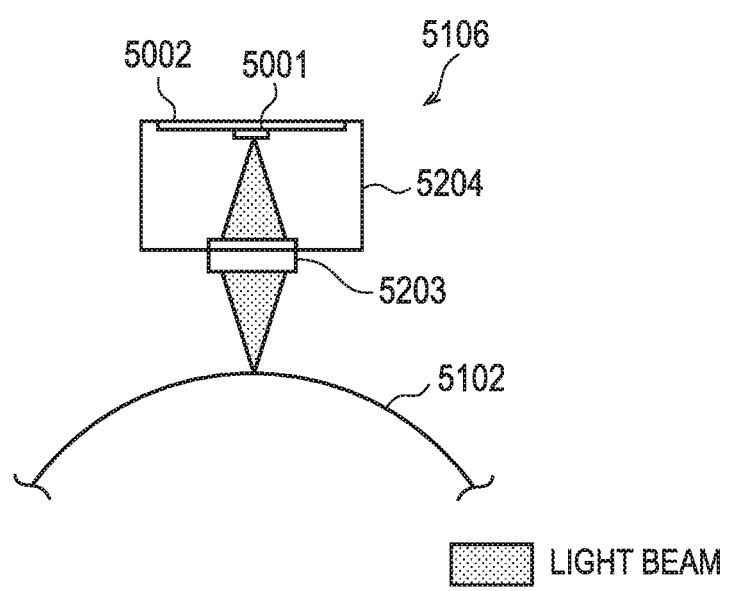
FIG. 7B is a diagram illustrating the configuration of the exposure head of the fifth example.

FIG. 7A and FIG. 7B illustrate arrangement of the exposure head 5106 relative to the photosensitive drum 5102 and a view in which a light from the exposure head 5106 is captured on the surface of the photosensitive drum 5102. The exposure head 5106 is arranged so as to face the photosensitive drum 5102. Each of the exposure head 5106 and the photosensitive drum 5102 is attached to the image forming apparatus by an attachment member (not illustrated) for use.

It is preferable that the exposure head 5106 be configured to perform focus adjustment and light amount adjustment at each spot so that an assembly and adjustment operation is performed for a single exposure head in a factory and a light collecting position is located at an appropriate position when attached to an image forming apparatus. Herein, the components are arranged such that the distance between the photosensitive drum 5102 and the rod lens array 5203 and the distance between the rod lens array 5203 and the surface light-emitting element array chip group 5001 form predetermined gaps. Thereby, a light from the exposure head 5106 is captured on the photosensitive drum 5102. Thus, in focus adjustment, an attachment position of the rod lens array 5203 is adjusted so that the distance between the rod lens array 5203 and the surface light-emitting element array chip group 5001 is a desired value. Further, in light amount adjustment, light-emitting thyristors are sequentially caused to emit light, and the drive current at each light-emitting thyristor is adjusted so that a light corrected via the rod lens array 5203 is a predetermined light amount.

Figure 8:
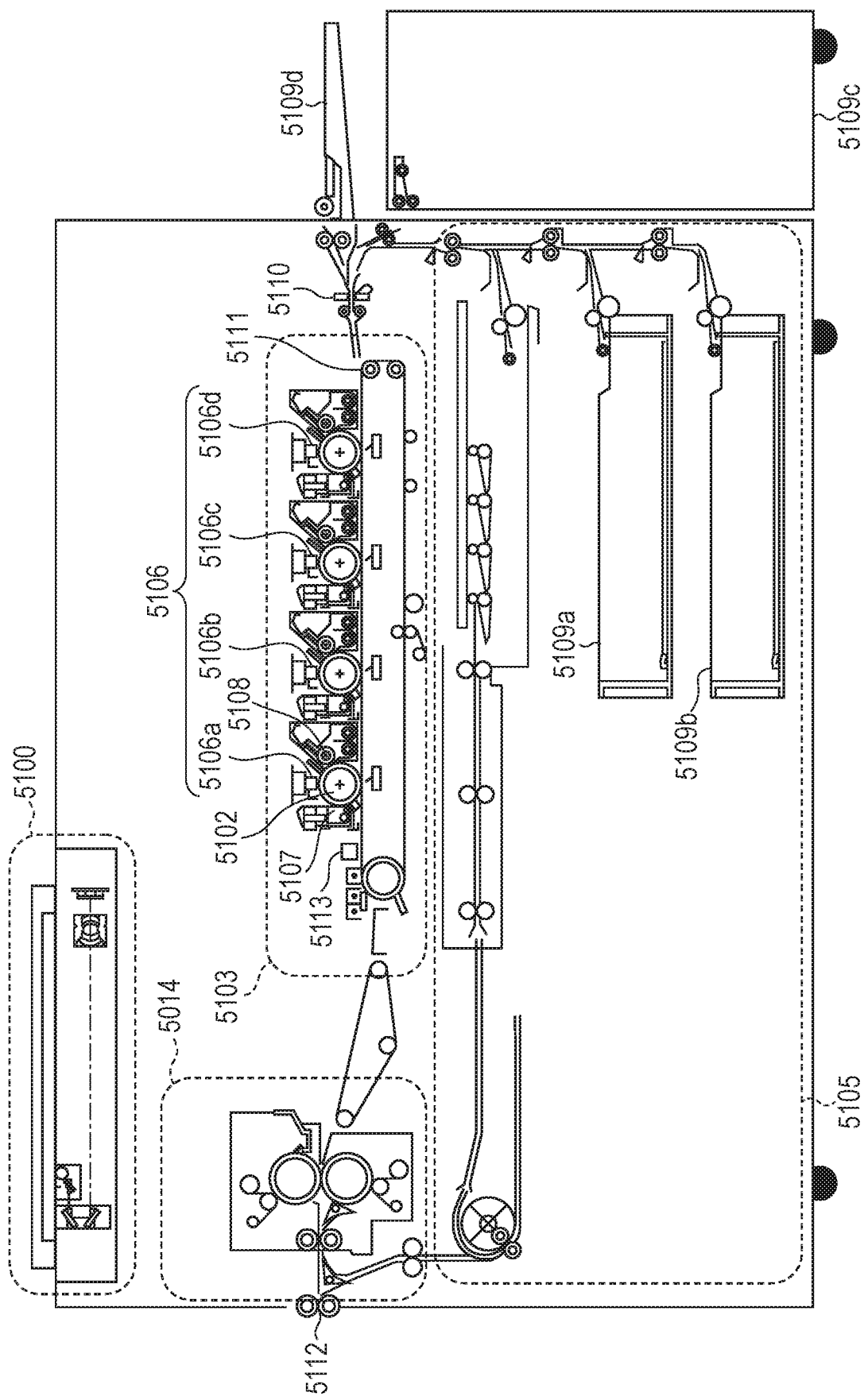
FIG. 8 is a diagram illustrating the configuration of an image forming apparatus of the fifth example.

Next, an image forming apparatus of the present example will be described with reference to FIG. 8. FIG. 8 is a diagram illustrating the configuration of the image forming apparatus of the present example.

An image forming apparatus of the present example is an electrophotographic image forming apparatus using the exposure head 5106. This image forming apparatus of the present example has a scanner unit 5100, an imaging unit 5103, a fixing unit 5104, a sheet feed/transport unit 5105, and an image forming control unit (not illustrated) that controls these components.

The scanner unit 5100 emits lighting to a document placed on a document stage to optically read an image of the document and converts the image into an electrical signal to create image data.

The imaging unit 5103 has a plurality of development units that perform development by using an electrophotographic process. Each development unit has the photosensitive drum 5102, the exposure head 5106, a charger 5107, and a developer 5108. The development unit may be a process cartridge accommodating a configuration used for development of a toner image. In such a case, it is preferable that the process cartridge be removable with respect to the main body of the image forming apparatus.

The photosensitive drum 5102 is an image carrier on which an electrostatic latent image is formed. The photosensitive drum 5102 is rotary-driven and charged by the charger 5107.

The exposure head 5106 irradiates the photosensitive drum 5102 with a light in accordance with the image data and forms an electrostatic latent image on the photosensitive drum 5102. Specifically, the exposure head 5106 collects light generated from the chip face of the surface light-emitting element array chip group 5001 onto the photosensitive drum 5102 by the rod lens array 5203 and forms an electrostatic latent image in accordance with image data on the photosensitive drum 5102.

The developer 5108 supplies a toner (development agent) to an electrostatic latent image formed on the photosensitive drum 5102 to perform development. The toner is accommodated in an accommodation unit. It is preferable that the accommodation unit accommodating a toner be included in the development unit. The developed toner image (development agent image) is transferred on a recording medium such as a sheet transported on a transfer belt 5111.

The image forming apparatus of the present example has four development units (development stations) that perform development by using a series of electrophotographic processes and forms a desired image by transferring a toner image from each development unit. The four development units have respective toners of different colors. Specifically, four development units aligned in the order of cyan (C), magenta (M), yellow (Y), and black (K) sequentially perform imaging operations with magenta, yellow, and black after a predetermined period elapses from start of an imaging operation with cyan.

The sheet feed/transport unit 5105 feeds a sheet from a sheet feed unit which is instructed in advance out of in-housing sheet feed units 5109a and 5109b, an external sheet feed unit 5109c, and a bypass sheet feed unit 5109d. A fed sheet is transported to a registration roller 5110.

The registration roller 5110 transports a sheet on the transfer belt 5111 so that a toner image formed in the imaging unit 5103 described above is transferred on the sheet.

An optical sensor 5113 is arranged so as to face a face on which a toner image of the transfer belt 5111 is transferred and performs position detection of a test chart printed on the transfer belt 5111 in order to calculate a color displacement between development units. The color displacement calculated here is transmitted to an image controller unit (not illustrated) and used for correction of an image position of each color. This control enables a full-color toner image without color displacement to be transferred on a sheet.

The fixing unit 5104 incorporates a plurality of rollers and a heat source such as a halogen heater, uses heat and pressure to dissolve and fix a toner on a sheet on which a toner image has been transferred from the transfer belt 5111, and discharges the sheet out of the image forming apparatus by using a sheet discharge roller 5112.

The image forming control unit (not illustrated) is connected to a multifunction printer (MFP) control unit that controls the overall MFP including the image forming apparatus and performs control in accordance with an instruction from the MFP control unit. Further, the image forming control unit provides an instruction so that the entirety can maintain coordination to smoothly operate while managing the states of the scanner unit 5100, the imaging unit 5103, the fixing unit 5104, and the sheet feed/transport unit 5105 described above.

In the image forming apparatus using the exposure head as described above, since the number of components to be used is small, this facilitates reduction in size or reduction in cost of the apparatus compared to a laser scanning type image forming apparatus that polarizes and scans a laser beam by using a polygon motor.

According to one aspect of the present invention, it is possible to realize a light-emitting thyristor with improved light emission efficiency while maintaining the function as a thyristor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-040659, filed Mar. 6, 2019, which is hereby incorporated by reference herein in its entirety.

What is claimed is:

1. A light-emitting thyristor comprising a layered structure having a semiconductor DBR layer, a first semiconductor layer of a first conductivity type, a second semiconductor layer of a second conductive type, a third semiconductor layer, and a fourth semiconductor layer of the second conductivity type in this order on a semiconductor substrate,
wherein the third semiconductor layer has at least one fifth semiconductor layer of the first conductivity type and a multi-quantum well structure,
wherein the fifth semiconductor layer is present between the second semiconductor layer and the multi-quantum well structure,
wherein the multi-quantum well structure is formed of barrier layers and quantum well layers, and
wherein the number of the quantum well layers is greater than or equal to 10.

2. The light-emitting thyristor according to claim 1, wherein the third semiconductor layer has another fifth semiconductor layer of the first conductivity type present between the multi-quantum well structure and the fourth semiconductor layer.

3. The light-emitting thyristor according to claim 1, wherein the number of the quantum well layers is set in accordance with a bandgap difference that is a difference between a bandgap of the barrier layers and a bandgap of the quantum well layers.

4. The light-emitting thyristor according to claim 3,
wherein the bandgap difference is less than or equal to 0.15 eV, and
wherein the number of the quantum well layers is less than or equal to 50.

5. The light-emitting thyristor according to claim 3,
wherein the bandgap difference is less than or equal to 0.105 eV, and
wherein the number of the quantum well layers is less than or equal to 75.

6. The light-emitting thyristor according to claim 3, wherein the number of the quantum well layers is set in accordance with the bandgap difference and a drive voltage.

7. The light-emitting thyristor according to claim 1, wherein the multi-quantum well structure is of the first conductivity type or an i-type.

8. The light-emitting thyristor according to claim 1, wherein the semiconductor substrate is a GaAs substrate.

9. The light-emitting thyristor according to claim 1, wherein the semiconductor substrate is of a conductivity type of an n-type or a p-type.

10. The light-emitting thyristor according to claim 1, wherein the second semiconductor layer and the third semiconductor layer are formed of an AlGaAs-based material.

11. A light-emitting thyristor array comprising a plurality of light-emitting thyristors according to claim 1,
wherein the plurality of light-emitting thyristors are aligned one-dimensionally.

12. An exposure head comprising:
the light-emitting thyristor array according to claim 11; and
an optical system that collects a light from the light-emitting thyristor array.

13. An image forming apparatus comprising:
an image carrier;
a charging unit that charges a surface of the image carrier;
an exposure head that exposes the surface of the image carrier charged by the charging unit and forms an electrostatic latent image on the surface of the image carrier;
a development unit that develops the electrostatic latent image formed by the exposure head; and
a transfer unit that transfers an image developed by the development unit onto a recording medium,
wherein the exposure head has the light-emitting thyristor array according to claim 11.

14. A light-emitting thyristor comprising a layered structure having a semiconductor DBR layer, a first semiconductor layer of a first conductivity type, a second semiconductor layer, a third semiconductor layer of the first conductivity type, and a fourth semiconductor layer of a second conductivity type in this order on a semiconductor substrate,
wherein the second semiconductor layer has at least one fifth semiconductor layer of the second conductivity type and a multi-quantum well structure,
wherein the fifth semiconductor layer is present between the first semiconductor layer and the multi-quantum well structure,
wherein the multi-quantum well structure is formed of barrier layers and quantum well layers, and
wherein the number of the quantum well layers is greater than or equal to 10.

15. The light-emitting thyristor according to claim 14, wherein the semiconductor substrate is a GaAs substrate.

16. The light-emitting thyristor according to claim 14, wherein the semiconductor substrate is of a conductivity type of an n-type or a p-type.

17. The light-emitting thyristor according to claim 14, wherein the second semiconductor layer and the third semiconductor layer are formed of an AlGaAs-based material.

18. A light-emitting thyristor array comprising a plurality of light-emitting thyristors according to claim 14, wherein the plurality of light-emitting thyristors are aligned one-dimensionally.

19. An exposure head comprising:
the light-emitting thyristor array according to claim 18; and
an optical system that collects a light from the light-emitting thyristor array.

20. An image forming apparatus comprising:
an image carrier;
a charging unit that charges a surface of the image carrier;
an exposure head that exposes the surface of the image carrier charged by the charging unit and forms an electrostatic latent image on the surface of the image carrier;
a development unit that develops the electrostatic latent image formed by the exposure head; and
a transfer unit that transfers an image developed by the development unit onto a recording medium,
wherein the exposure head has the light-emitting thyristor array according to claim 18.

* * * * *